United States Patent
Kim

(10) Patent No.: US 8,324,050 B2
(45) Date of Patent: Dec. 4, 2012

(54) METHOD OF MANUFACTURING FLASH MEMORY DEVICE

(75) Inventor: Jae Mun Kim, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 367 days.

(21) Appl. No.: 12/648,005

(22) Filed: Dec. 28, 2009

(65) Prior Publication Data

US 2010/0184283 A1    Jul. 22, 2010

(30) Foreign Application Priority Data

Jan. 21, 2009   (KR) ........................ 10-2009-0005061

(51) Int. Cl.
*H01L 21/336* (2006.01)
(52) U.S. Cl. ................. 438/257; 257/E21.687
(58) Field of Classification Search ............ 438/257, 438/593, 201; 257/315, E21.422, E21.687
See application file for complete search history.

(56) References Cited

U.S. PATENT DOCUMENTS 7,799,634 B2 *  9/2010  Shen et al. ............. 438/257

FOREIGN PATENT DOCUMENTS

| KR | 10-2004-0025619 | 3/2004 |
| KR | 10-2005-0003533 | 1/2005 |
| KR | 10-2005-0023932 | 3/2005 |
| KR | 10-0494321 | 5/2005 |

* cited by examiner

*Primary Examiner* — Quoc Hoang
(74) *Attorney, Agent, or Firm* — Marshall, Gerstein & Borun LLP

(57) ABSTRACT

A method of manufacturing a flash memory device comprises forming a gate insulating layer on a semiconductor substrate, forming silicon seed crystals on a surface of the gate insulating layer by reacting a nitrogen or oxygen atmosphere gas and a silicon source gas, forming a first layer for a floating gate over the gate insulating layer and the silicon seed crystals by increasing an amount of the silicon source gas, and forming a second layer for a floating gate on the first layer for a floating gate.

19 Claims, 2 Drawing Sheets

METHOD OF MANUFACTURING FLASH MEMORY DEVICE

CROSS-REFERENCE TO RELATED APPLICATION

Priority to Korean patent application number 10-2009-0005061 filed on Jan. 21, 2009, the entire disclosure of which is incorporated by reference herein, is claimed.

BACKGROUND

An embodiment relates generally to a method of manufacturing a flash memory device and, more particularly, to a method of manufacturing a flash memory device that is capable of improving the charge distribution of a floating gate by forming a polysilicon layer for a floating gate with a uniform distribution of grains, each having a small grain size.

To increase the storage capacity of a flash memory device, research has been carried out on the development of a multi-level cell (MLC) whose charge storage capacity per cell is increased from 1 bit to 2 to 4 bits. To manufacture a device having the charge storage capacity of 2 to 4 bits, very strict charge distribution criteria must be satisfied. To satisfy the charge distribution criteria, a polysilicon layer for a floating gate having a uniform distribution of grains, each having a small grain size must be formed.

To implement the polysilicon layer for a floating gate, an undoped polysilicon layer is formed and a doped polysilicon layer is formed over the undoped polysilicon layer. Importantly, the undoped polysilicon layer must be formed as thin as possible in order to reduce the grain size, and must have a thickness of 100 Å or less to greatly improve the charge distribution of the floating gate. Where the undoped polysilicon layer is thinly formed, the undoped polysilicon layer is grown in the form of an island to thereby form a discontinuous thin film, or a continuous thin film is formed with a surface that is very coarse (i.e., not smooth).

BRIEF SUMMARY

An embodiment relates to a polysilicon layer for a floating gate with a uniform distribution of grains, each having a small grain size in order to improve the charge distribution of the floating gate.

A method of manufacturing a flash memory device according to an aspect of this disclosure comprises forming a gate insulating layer on a semiconductor substrate, forming silicon seed crystals on a surface of the gate insulating layer by reacting a nitrogen or oxygen atmosphere gas and a silicon source gas, forming a first layer for a floating gate over the gate insulating layer and the silicon seed crystals by increasing an amount of the silicon source gas, and forming a second layer for a floating gate on the first layer for a floating gate.

An in-situ annealing process is performed using an $N_2O$ gas or an NO gas on the gate insulating layer after forming the gate insulating layer.

The nitrogen or the oxygen atmosphere gas is used an $NH_3$ gas or an $N_2O$ gas.

The silicon seed crystals and the first layer for a floating gate are formed by injecting the nitrogen or oxygen atmosphere gas 1 L to 12 L into a chamber.

The silicon seed crystals are formed by injecting the silicon source gas 0.1 L to 5 L into a chamber.

The first layer for a floating gate preferably is formed to a thickness of 50 Å to 200 Å by injecting the silicon source gas 1 L to 10 L into a chamber.

The silicon seed crystals and the first layer for a floating gate preferably are formed in-situ.

The second layer for a floating gate preferably is formed by injecting a silicon source gas and an impurity doping gas into a chamber.

The silicon source gas preferably is a $SiH_4$ gas, and the impurity doping gas preferably is a $PH_3$ gas.

The second layer for a floating gate preferably is formed by further injecting one of an $N_2O$ gas and an $NH_3$ gas into the chamber in addition to the silicon source gas and the impurity doping gas.

A method of manufacturing a flash memory device according to another aspect of this disclosure comprises forming a gate insulating layer on a semiconductor substrate, forming silicon seed crystals on a surface of the gate insulating layer by reacting a nitrogen or oxygen atmosphere gas and a silicon source gas, forming an undoped amorphous polysilicon layer over the gate insulating layer and the silicon seed crystals by increasing an amount of the silicon source gas, and forming an undoped crystalline polysilicon layer by crystallizing the undoped amorphous polysilicon layer. An annealing process is performed in-situ using an $N_2O$ gas or an NO gas on the gate insulating layer to remove trapped charges existing at an interface between the semiconductor substrate and the gate insulating layer after forming the gate insulating layer.

The nitrogen or the oxygen atmosphere gas is used an $NH_3$ gas or an $N_2O$ gas. The silicon seed crystals and the undoped amorphous polysilicon layer are formed by injecting the nitrogen or oxygen atmosphere gas 1 L to 12 L into a chamber.

The silicon seed crystals is formed by injecting the silicon source gas 0.1 L to 5 L into a chamber.

The undoped amorphous polysilicon layer preferably is formed to a thickness of 50 Å to 200 Å by injecting the silicon source gas 1 L to 10 L into a chamber.

The silicon seed crystals and the undoped amorphous polysilicon layer preferably are formed in-situ.

The undoped crystalline polysilicon layer is formed by performing an annealing process at a temperature in a range of 750° C. to 1000° C. by injecting an $N_2$ gas into a chamber.

DESCRIPTION OF EMBODIMENT

An embodiment of the present disclosure is described in detail below with reference to the accompanying drawings. The figures are provided to allow those having ordinary skill in the art to understand the scope of the embodiment of the disclosure.

FIGS. 1A to 1D are cross-sectional views illustrating a method of manufacturing a flash memory device according to an embodiment of this disclosure.

Figure 1A:
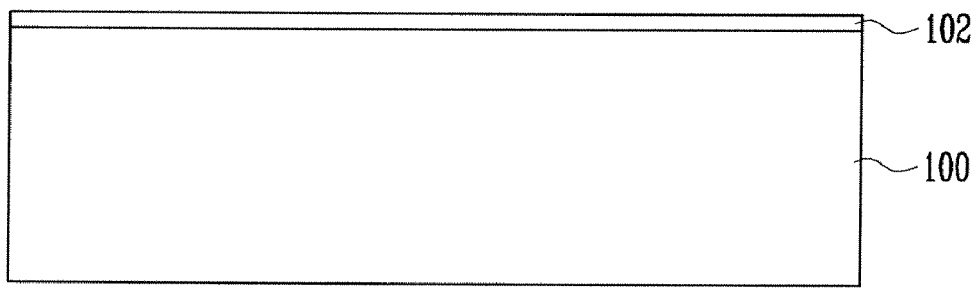
FIGS. 1A to 1D are cross-sectional views illustrating a method of manufacturing a flash memory device according to an embodiment of this disclosure.

Referring to FIG. 1A, a gate insulating layer 102 for tunneling electrons is formed on a semiconductor substrate 100. The gate insulating layer 102 may also be referred to as a tunnel insulating layer and preferably comprises an oxide layer.

The gate insulating layer 102 preferably is formed through a radical oxidization method using a mixed gas comprising an $O_2$ gas and an $H_2$ gas at a temperature in a range of 700° C. to 900° C. After forming the gate insulating layer 102, an annealing process, preferably using an $N_2O$ gas or an NO gas, preferably is performed in-situ on the gate insulating layer 102 to remove trapped charges existing at the interface between the semiconductor substrate 100 and the gate insulating layer 102.

Figure 1B:
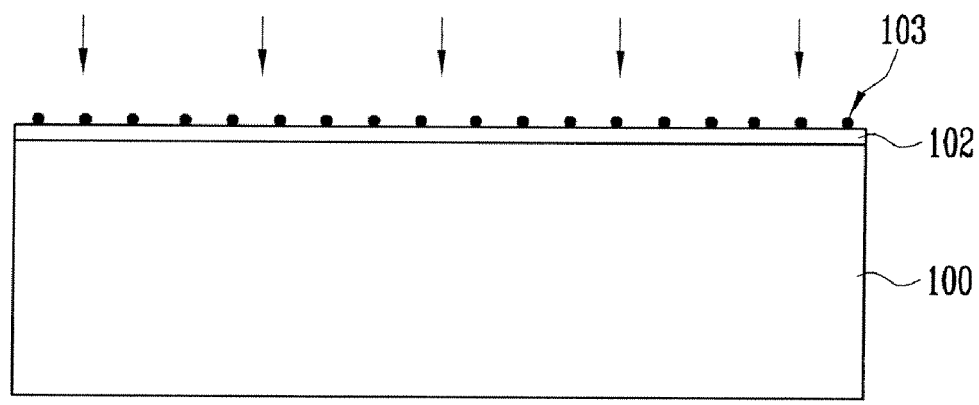

Referring to FIG. 1B, a number of silicon seed crystals 103 are formed on the gate insulating layer 102, preferably by reacting a nitrogen or oxygen atmosphere gas and a silicon source gas.

The silicon seed crystals 103 preferably are formed by injecting an $N_2O$ gas or an $NH_3$ gas (i.e., the nitrogen or oxygen atmosphere gas) 1 L to 12 L into a chamber, injecting a $SiH_4$ gas (i.e., the silicon source gas) 0.1 L to 5 L into the chamber, and then performing a deposition process for 10 seconds to 300 seconds. Chemical vapor deposition (CVD) preferably is used as the deposition process. The nitrogen or oxygen atmosphere gas functions to densify and uniformly distribute the silicon seed crystals 103.

Figure 1C:
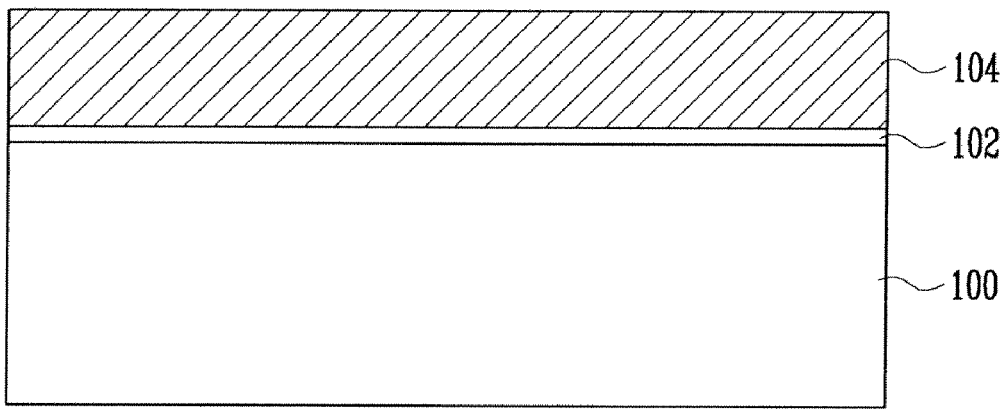

Referring to FIG. 1C, while maintaining the amount of the nitrogen or oxygen atmosphere gas, the amount of the silicon source gas is increased such that a first layer 104 for a floating gate is formed on the gate insulating layer 102 having the silicon seed crystals 103 formed thereon.

The first layer 104 for a floating gate preferably is formed through two processes. First, in the first process, an $NH_3$ gas or an $N_2O$ gas (i.e., the nitrogen or oxygen atmosphere gas) is injected 1 L to 12 L into the chamber, and a $SiH_4$ gas (i.e., the silicon source gas) is injected 1 L to 10 L into the chamber to form an undoped amorphous polysilicon layer, preferably having a thickness of 50 Å to 200 Å at a temperature in a range of 400° C. to 600° C. Next, in the second process, an $N_2$ gas is injected into the chamber, and the undoped amorphous polysilicon layer is crystallized by performing a first annealing process, preferably at a temperature in a range of 750° C. to 1000° C., thereby forming an undoped crystalline polysilicon layer. The first annealing process preferably is performed using a rapid thermal processing (RTP), preferably for 1 second to 30 seconds.

The first layer 104 for a floating gate preferably is formed from the undoped crystalline polysilicon layer that is crystallized by the first annealing process about the dense and uniformly-distributed silicon seed crystals 103. Accordingly, the first layer 104 has a uniform distribution of grains, each grain having a small grain size. Consequently, the first layer 104 for a floating gate comprises a continuous thin film and a smooth surface even though it is formed to a thickness of 50 Å to 200 Å in a preferred embodiment.

The silicon seed crystals 103 and the first layer 104 for a floating gate preferably are formed in-situ.

Figure 1D:
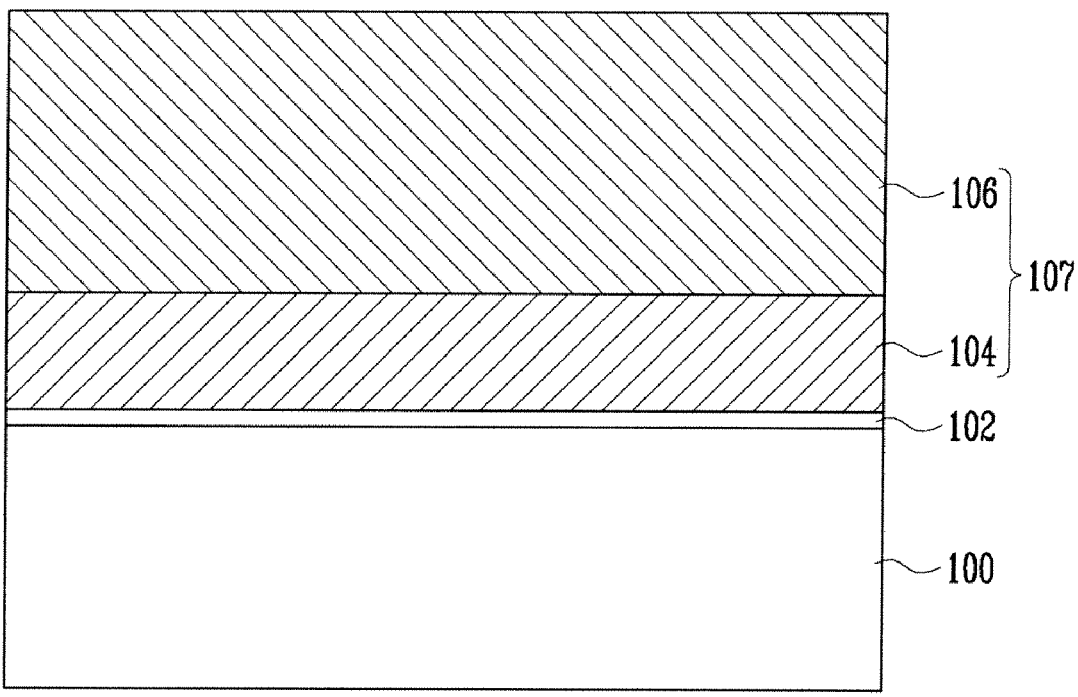

Referring to FIG. 1D, a second layer 106 for a floating gate is formed on the first layer 104 for a floating gate. Accordingly, a floating gate 107 in which the first layer 104 for a floating gate and the second layer 106 for a floating gate are stacked is formed.

Before forming the second layer 106 for a floating gate, a process of cleaning a surface of the first layer 104 for a floating gate preferably is to remove native oxides that may exist on the surface of the first layer 104 for a floating gate. The cleaning process preferably is performed using a hydrofluoric acid (HF) solution or a buffered oxide etchant (BOE) solution.

The second layer 106 for a floating gate preferably is formed through two processes. In a first process, a doped amorphous polysilicon layer, preferably having a thickness of 400 Å to 1000 Å is formed, preferably at a temperature in a range of 400° C. to 600° C. under a pressure in a range of 0.5 Torr to 2 Torr by injecting a silicon source gas and an impurity doping gas into the chamber. Next, in a second process, a doped crystalline polysilicon layer is formed by injecting an $N_2$ gas into the chamber and crystallizing the doped amorphous polysilicon layer using a second annealing process, preferably at a temperature in a range of 750° C. to 1000° C. The doped amorphous polysilicon layer can be crystallized by other processes that is proceeded after forming the floating gate without performing the second annealing process. A $SiH_4$ gas preferably is used as the silicon source gas, and a $PH_3$ gas preferably is used as the impurity doping gas. The silicon source gas and the impurity doping gas used when forming the floating gate are not limited to the preferred $SiH_4$ and $PH_3$ gases, and the doped amorphous polysilicon layer can be formed, preferably by a Low Pressure Chemical Vapor Depostion (LPCVD) method using gases other than the $SiH_4$ and $PH_3$ gases.

Meanwhile, the doped amorphous polysilicon layer is formed, preferably by further injecting one of an $N_2O$ gas or an $NH_3$ gas into the chamber in addition to the silicon source gas and the impurity doping gas.

The second layer 106 for a floating gate comprises the doped crystalline polysilicon layer that is crystallized by the second annealing process about the first layer 104 for a floating gate, comprising a uniform distribution of grains, each grain having a small grain size. Accordingly, as in the first layer 104 for a floating gate, the second layer 106 has a uniform distribution of grains, each having a small grain size. Consequently, the floating gate comprising the stack of the first layer and the second layer each having a uniform distribution of grains each having a small grain size has a uniform charge distribution in any position.

Meanwhile, if a nitrogen or oxygen atmosphere gas supply line is included in an existing single wafer deposition apparatus, a polysilicon layer for a floating gate having a uniform distribution of grains each having a small grain size can be formed. Accordingly, the single wafer deposition apparatus preferably is used to perform the processes from the process of forming the gate insulating layer 102 to the process of forming the second layer 106 for a floating gate.

As described above, polysilicon layers for a floating gate having a uniform distribution of grains each having a small grain size are formed. Accordingly, charge distribution characteristics of the floating gate can be improved, the electrical properties of a flash memory device can be improved, the degree of integration in the same design rules can be increased, and an multi-level cell of 2 bits to 4 bits can be implemented.

Furthermore, as described above, if the nitrogen or oxygen atmosphere gas supply line used to form the polysilicon layers having a uniform distribution of grains each having a small grain size is included in the existing single wafer deposition apparatus, the polysilicon layers according to this disclosure can be implemented without additional equipment.

What is claimed is:
1. A method of manufacturing a flash memory device, the method comprising:
    forming a gate insulating layer on a semiconductor substrate;
    forming silicon seed crystals on a surface of the gate insulating layer by reacting a nitrogen or oxygen atmosphere gas and a silicon source gas;
    forming a first layer for a floating gate over the gate insulating layer and the silicon seed crystals by increasing an amount of the silicon source gas; and
    forming a second layer for a floating gate on the first layer for a floating gate.

2. The method of claim 1, comprising performing an annealing process in-situ using an $N_2O$ gas or an NO gas on the gate insulating layer after forming the gate insulating layer.

3. The method of claim 1, comprising using an $NH_3$ gas or an $N_2O$ gas as the nitrogen or oxygen atmosphere gas.

4. The method of claim 1, comprising forming the silicon seed crystals and the first layer for a floating gate by injecting the nitrogen or oxygen atmosphere gas 1 L to 12 L into a chamber.

5. The method of claim 1, comprising forming the silicon seed crystals by injecting the silicon source gas 0.1 L to 5 L into a chamber.

6. The method of claim 1, comprising forming the first layer for a floating gate to a thickness in a range of 50 Å to 200 Å injecting the silicon source gas 1 L to 10 L into a chamber.

7. The method of claim 1, comprising forming the silicon seed crystals and the first layer for a floating gate in-situ.

8. The method of claim 1, comprising forming the second layer for a floating gate by injecting a silicon source gas and an impurity doping gas into a chamber.

9. The method of claim 8, wherein:
the silicon source gas is a $SiH_4$ gas, and
the impurity doping gas is a $PH_3$ gas.

10. The method of claim 8, comprising forming the second layer for a floating gate by further injecting one of an $N_2O$ gas and an $NH_3$ gas into the chamber in addition to the silicon source gas and the impurity doping gas.

11. A method of manufacturing a flash memory device, the method comprising:
forming a gate insulating layer on a semiconductor substrate;
forming silicon seed crystals on a surface of the gate insulating layer reacting a nitrogen or oxygen atmosphere gas and a silicon source gas;
forming an undoped amorphous polysilicon layer over the gate insulating layer including the silicon seed crystals by increasing an amount of the silicon source gas;
forming a doped crystalline polysilicon layer on the undoped crystalline polysilicon layer.

12. The method of claim 11, comprising performing an annealing process in-situ using an $N_2O$ gas or an NO gas on the gate insulating layer to remove trapped charges existing at an interface between the semiconductor substrate and the gate insulating layer after forming the gate insulating layer.

13. The method of claim 11, comprising using an $NH_3$ gas or an $N_2O$ gas as the nitrogen or oxygen atmosphere gas.

14. The method of claim 11, comprising forming the silicon seed crystals and the undoped amorphous polysilicon layer by injecting the nitrogen or oxygen atmosphere gas 1 L to 12 L into a chamber.

15. The method of claim 11, comprising forming the silicon seed crystals by injecting the silicon source gas 0.1 L to 5 L into a chamber.

16. The method of claim 11, comprising forming the undoped amorphous polysilicon layer to a thickness of 50 Å to 200 Å by injecting the silicon source gas 1 L to 10 L into a chamber.

17. The method of claim 11, comprising forming the silicon seed crystals and the undoped amorphous polysilicon layer in-situ.

18. The method of claim 11, comprising forming the undoped crystalline polysilicon layer by performing an annealing process at a temperature in a range of 750° C. to 1000° C. injecting an $N_2$ gas into a chamber.

19. The method of claim 11, further comprising cleaning a surface of the undoped crystalline polysilicon layer before forming the doped crystalline polysilicon layer.

\* \* \* \* \*